United States Patent
Moret (10) Patent No.: US 10,120,018 B2
(45) Date of Patent: Nov. 6, 2018

(54) ADAPTIVE THERMAL ACTUATOR ARRAY FOR WAFER-LEVEL APPLICATIONS

(71) Applicant: Intel Corporation, Santa Clara, CA (US)

(72) Inventor: Eric J. M. Moret, Beaverton, OR (US)

(73) Assignee: INTEL CORPORATION, Santa Clara, CA (US)

(*) Notice: Subject to any disclaimer, the term of this patent is extended or adjusted under 35 U.S.C. 154(b) by 26 days.

(21) Appl. No.: 15/259,934

(22) Filed: Sep. 8, 2016

(65) Prior Publication Data

US 2018/0067160 A1 Mar. 8, 2018

(51) Int. Cl.
*G01R 31/28* (2006.01)
*G01R 1/073* (2006.01)

(52) U.S. Cl.
CPC ..... *G01R 31/2875* (2013.01); *G01R 1/07392* (2013.01); *G01R 31/2891* (2013.01)

(58) Field of Classification Search
CPC ............ G01R 31/2875; G01R 31/2891; G01R 1/07392
USPC ......... 324/750.06, 500, 537, 750.01, 750.03, 324/750.05
See application file for complete search history.

(56) References Cited

U.S. PATENT DOCUMENTS

| | | | | |
|---|---|---|---|---|
| 4,443,117 A | * | 4/1984 | Muramoto | G01D 18/008 374/1 |
| 4,984,731 A | * | 1/1991 | Imamura | H01L 21/67144 228/102 |
| 6,471,913 B1 | * | 10/2002 | Weaver | H01L 21/67103 118/725 |
| 8,797,053 B2 | | 8/2014 | Rutigliano et al. | |
| 9,279,854 B2 | | 3/2016 | Johnson et al. | |
| 2017/0060150 A1 | * | 3/2017 | Stefanski | G05D 23/27 |
| 2018/0036740 A1 | * | 2/2018 | Nelson | B02C 19/18 |
| 2018/0059176 A1 | * | 3/2018 | Ding | G01R 31/2891 |

* cited by examiner

*Primary Examiner* — Giovanni Astacio-Oquendo
(74) *Attorney, Agent, or Firm* — Schwabe, Williamson & Wyatt, P.C.

(57) ABSTRACT

Embodiments of the present disclosure describe wafer-level die testing devices having a base with a planar X-Y surface, a plurality of thermal actuators situated on the surface, wherein one or more of the plurality of thermal actuators is movable in relation to the base in at least one of the X or the Y directions, and one or more adjustable links, wherein each adjustable link is to adjust a relative position between an individual thermal actuator of the plurality of thermal actuators and one or more other thermal actuators of the plurality of thermal actuators in one or more of the X or the Y directions. Other embodiments may be described and/or claimed.

25 Claims, 8 Drawing Sheets

ADAPTIVE THERMAL ACTUATOR ARRAY FOR WAFER-LEVEL APPLICATIONS

TECHNICAL FIELD

The present disclosure relates generally to the field of semiconductor fabrication and test equipment and, more specifically, to thermal actuators used in automatic test equipment.

BACKGROUND

Semiconductor testing is traditionally performed by connecting an Automatic Test Equipment (ATE), or "tester" to a device under tester (DUT) via a Sort or Test interface unit (SIU, TIU, xIU), also known as a probe card. In high volume semiconductor testing, known-good-die (KGD), is the idea that one can fully test the device prior to packaging it, thereby providing a cost-effective final packaged unit. However, KGD may present serious equipment challenges where other factors compete, resulting in compromises of settling for a not quite known good die, higher test costs, or both. Additionally, previous wafer-level testing techniques typically use a monolithic chuck, which may prevent any dynamic/active thermal control necessary for KGD. The monolithic chuck also cannot support test schemes in which the DUT is tested at two different temperature set points.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Embodiments herein may include wafer-level die testing devices having a base with a planar X-Y surface in an X-Y-Z Cartesian coordinate system and a plurality of thermal actuators situated on the surface, where one or more of the thermal actuators is movable in relation to the base in at least one of the X or the Y directions. In various embodiments, the wafer-level die testing devices may include one or more adjustable links to adjust a relative position between an individual thermal actuator of the plurality of thermal actuators and one or more other thermal actuators of the plurality of thermal actuators in one or more of the X or the Y directions.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. Components in the figures are not necessarily shown to scale.

Figure 1:
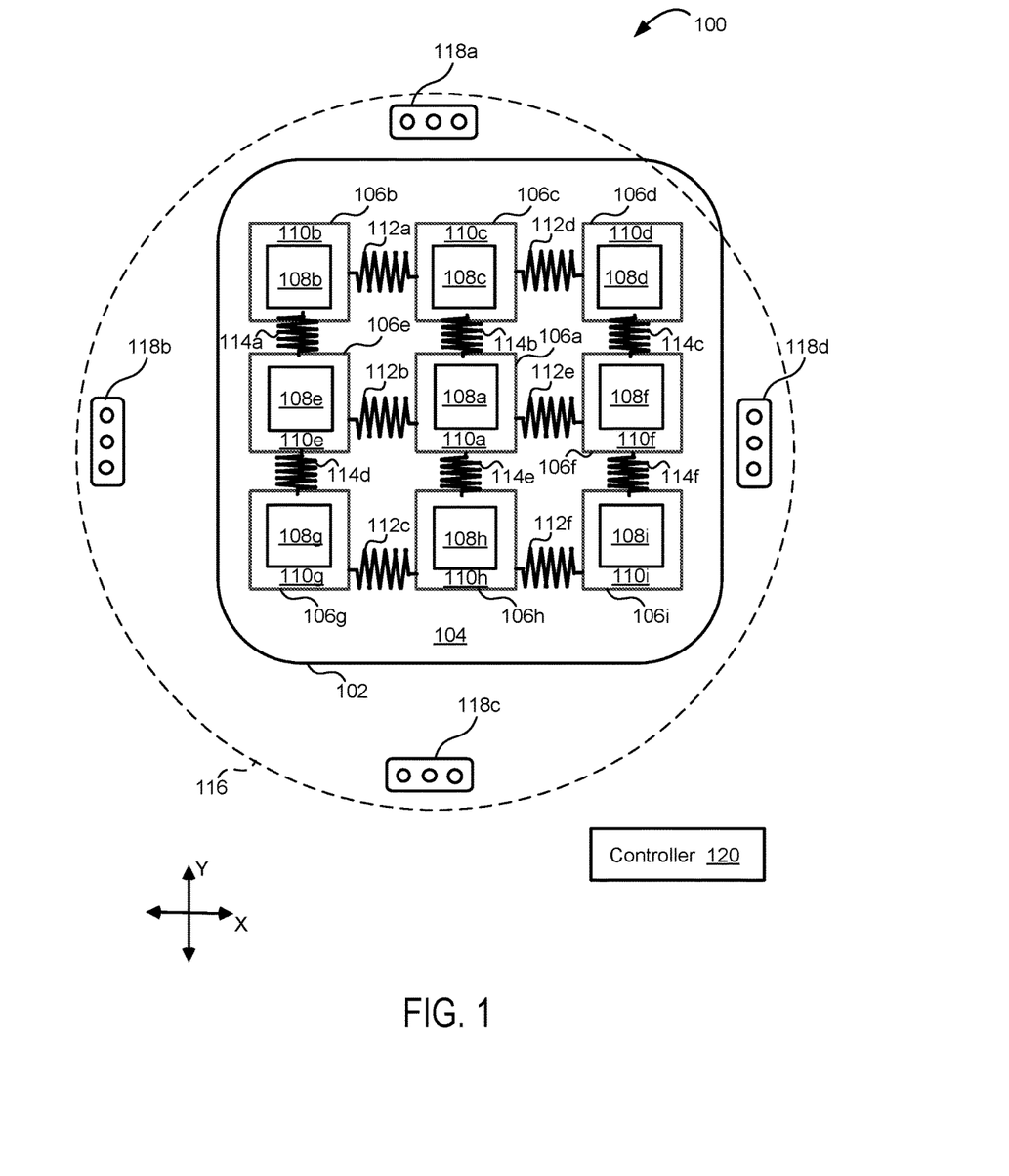
FIG. 1 schematically illustrates a top down schematic view of a wafer-level die testing device including an array of thermal actuators linked by actuators of variable controllable length, in accordance with various embodiments.

FIG. 1 schematically illustrates a top down schematic view of a wafer-level die testing device 100 including an array of thermal actuators linked by variable length linear actuators, in accordance with various embodiments. Although a 3×3 rectangular array of thermal actuators is shown, other configurations (e.g., triangular or hexagonal array) and/or other numbers of thermal actuators may be included in various embodiments. In some embodiments, the device 100 may include a base 102 that may have a planar X-Y surface 104 in an X-Y-Z Cartesian coordinate system. In various embodiments, a plurality of thermal actuators 106, shown as thermal actuators 106a, 106b, 106c, 106d, 106e, 106f, 106g, 106h, and 106i, may be situated on the surface 104. In various embodiments, the base 102 may be fixed, and may provide sufficient support and rigidity to with stand the total probing force applied to a DUT.

In some embodiments, one or more of the thermal actuators 106 may be movable in relation to the base 102 in at least one of the X or the Y directions. In various embodiments, each of the plurality of thermal actuators 106 may include a thermal surface, shown as thermal surfaces 108a through 108i and an actuator body 110, shown as actuator bodies 110a through 110i. Although the actuator bodies 110 are shown as extending outside of the thermal surfaces 108, they may be coextensive with the thermal surfaces 108 or may be narrower than the thermal surfaces 108 in various embodiments. In some embodiments, the thermal surfaces 108 may be larger than a surface of a DUT to better provide a uniform temperature across the DUT. In some embodiments, the wafer-level die testing device 100 may be compatible with some or all known forms of thermal interface material, including liquids (e.g., propanediol, or a fluorinated liquid such as FC-3283) and gases (e.g., air, helium).

In some embodiments, the device 100 may include one or more adjustable links to adjust a relative position between an individual thermal actuator of the plurality of thermal actuators 106 and one or more other thermal actuators of the plurality of thermal actuators 106 in one or more of the X or the Y directions. In various embodiments, the adjustable links may include a first plurality of adjustable links 112 (112a to 112f) oriented to adjust relative positions between the thermal actuators 106 in a first direction, and a second plurality of adjustable links 114 (114a to 114f) oriented to adjust relative positions between the thermal actuators 106 in a second direction orthogonal to the first direction. In various embodiments, the adjustable links 112 and/or the adjustable links 114 may include one or more types of linear actuators that may use a guide, screw drive, miniature hydraulics, a voice coil, an electromagnetic cylinder, or some other type of linear actuator.

In some embodiments, the first set of adjustable links 112 may be adjusted together to give an adjustable common X pitch between columns of thermal actuators 106. In various embodiments, the second set of adjustable links 114 may be adjusted together to give an adjustable common Y pitch between rows of thermal actuators 106. In some embodiments, one or more of the thermal actuators 106 may be fixed relative to the base 104. In some embodiments, a centrally located thermal actuator, such as thermal actuator 106a may be fixed relative to the base 104.

In various embodiments, the wafer-level die testing device 100 may be used to test dies on a wafer 116 that may be held in place by one or more peripheral vacuum wands 118, shown as peripheral vacuum wands 118a, 118b, 118c, and 118d. In some embodiments, a controller 120 may be in signal communication with the thermal actuators 106, adjustable links 112, the peripheral vacuum wands 118, and/or one or more positioning devices that are not shown for clarity. In some embodiments, coarse and fine wafer alignment techniques may be used. In various embodiments, the controller 120 may generate link control signals that may be used to adjust a length of one or more of the adjustable links 112. In some embodiments, the controller 120 may generate position control signals that may be used to adjust a position of one or more of the peripheral vacuum wands 118, the base 102, or a Z-height of one or more of the thermal actuators 106. In various embodiments, the controller 120 may receive signals from one or more sensors, such as sensed temperature and/or pressure values from one or more of the thermal actuators 106. In some embodiments, one or more of the adjustable links 112 may include manual length adjustment controls for manual adjustment of the adjustable links 112 instead of and/or in addition to having an adjustable length controlled by the controller 120.

Figure 2:
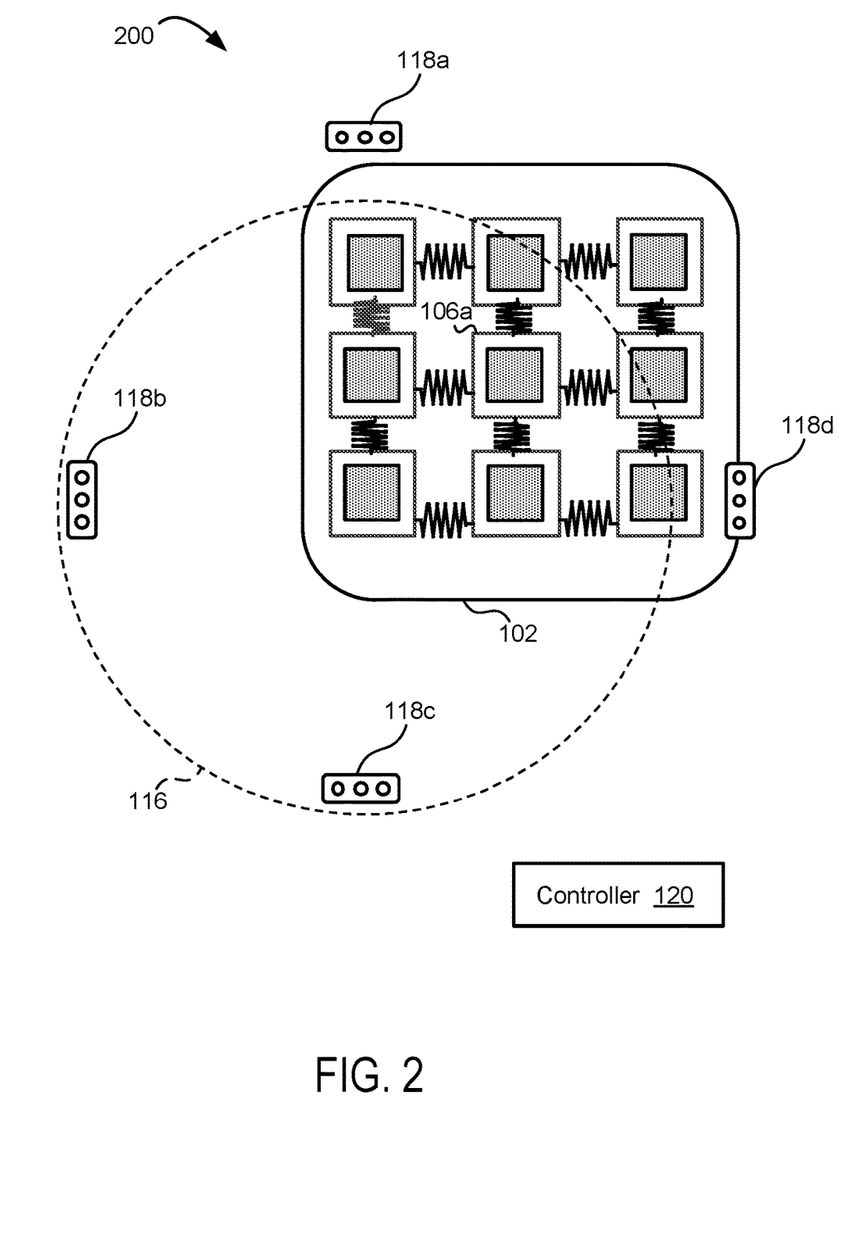
FIG. 2 schematically illustrates another top down schematic view of a different positioning of the base and thermal actuators of FIG. 1, in accordance with various embodiments.

FIG. 2 schematically illustrates a top down schematic view of a different positioning 200 of the base 102 and thermal actuators 106 in relation to the wafer 116, in accordance with various embodiments. In some embodiments, one or more of the peripheral vacuum wands 118 may be movable to allow access to edge dice on the wafer 116 by the thermal actuators 106. As shown, peripheral vacuum wands 118b and 118c are still being used to hold the wafer 116, while peripheral vacuum wands 118a and 118d have been moved out of the way to allow probing of edge dice. In some embodiments, a subset of vacuum wands may only release its hold on a wafer after a second subset is positioned and activated to support the wafer.

Figure 3:
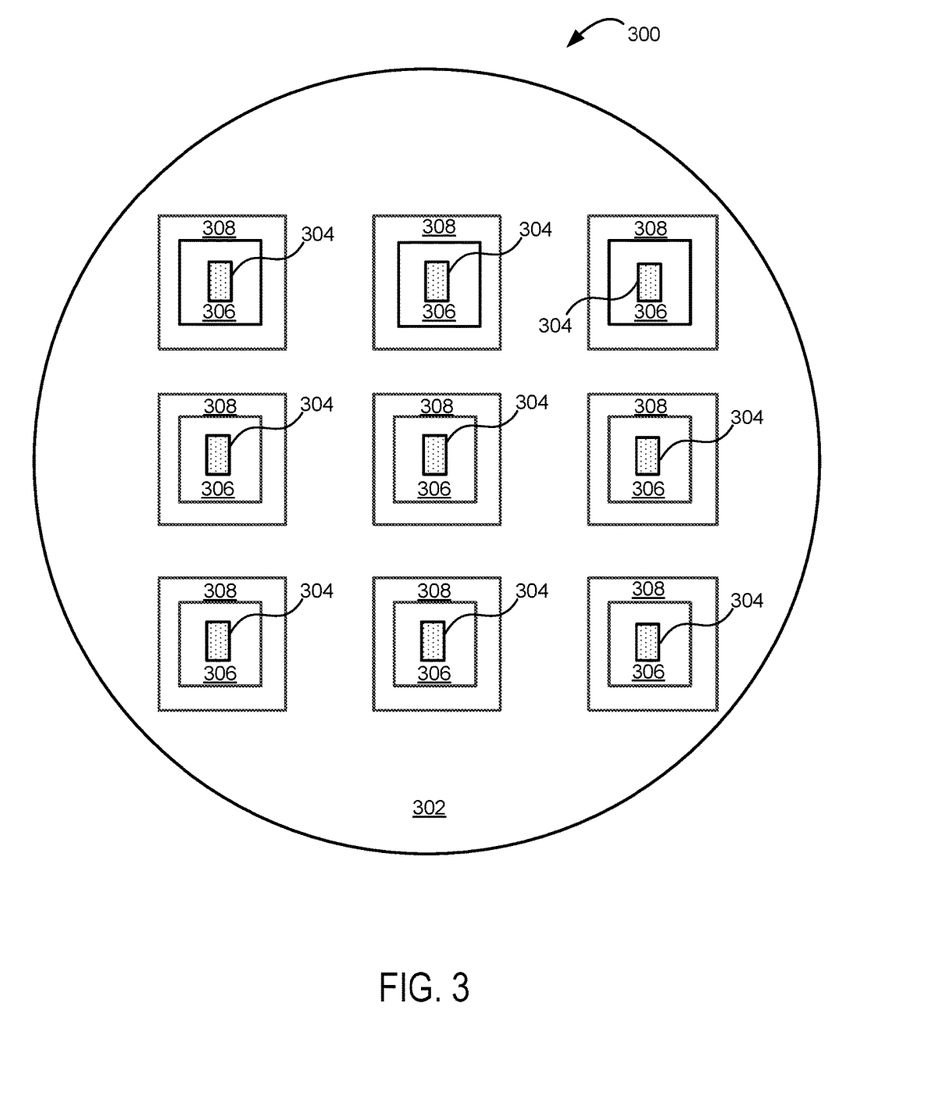
FIG. 3 schematically illustrates a bottom up schematic view of a modular probe card, in accordance with various embodiments.

FIG. 3 schematically illustrates a bottom up schematic view of a modular probe card 300, in accordance with various embodiments. In some embodiments, the modular probe card 300 may include a motherboard 302 and a plurality of probe arrays 304 that may be mounted to the motherboard 302 with a plurality of space transformers 306 and a plurality of mounting hardware 308. As shown, the modular probe card 300 includes a 3×3 rectangular array of probe arrays 304 that may be used in conjunction with a 3×3 rectangular adaptive thermal actuator array such as that shown in FIGS. 1 and 2. In various embodiments, the modular probe card 300 may in a configuration other than a rectangular array and/or may include a different number of probe arrays. A round prober sort interface unit (SIU) with a round motherboard 302 is shown, but a different shape such as a rectangular shape may be used in various embodiments.

Figure 4:
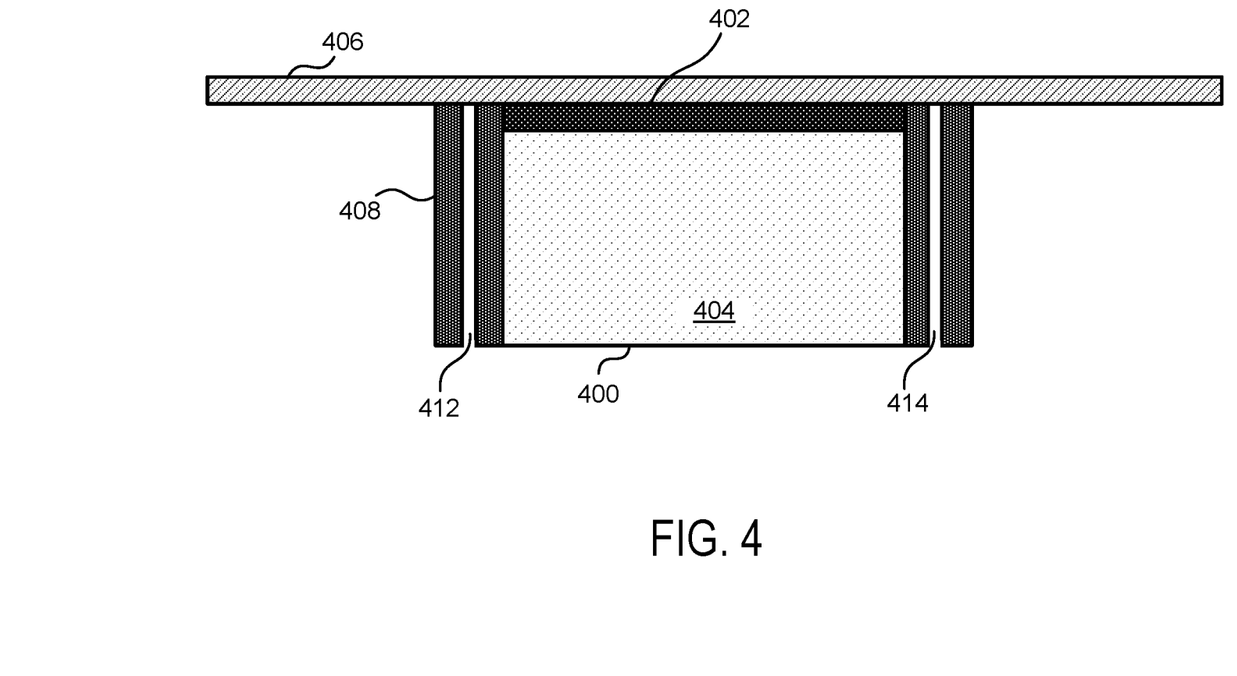
FIG. 4 schematically illustrates a cross-sectional view of a thermal actuator, in accordance with various embodiments.

FIG. 4 schematically illustrates a cross-sectional view of a thermal actuator 400, in accordance with various embodiments. In some embodiments, the thermal actuator 400 may be configured in similar fashion to one or more of the thermal actuators 106 of FIGS. 1 and 2. In various embodiments, the thermal actuator 400 may include a thermal surface 402 and a thermal actuator body 404. The thermal actuator 400 is shown with the thermal surface 402 in contact with a wafer 406. A surrounding jacket 408 and/or a first vacuum line 412 and a second vacuum line 414 may help hold the wafer 406 in contact with the thermal surface 402 in some embodiments. In some embodiments, the thermal actuator 400 does not have a vacuum hole or other vacuum component in an active thermal area such as the thermal surface 402. In various embodiments, a controller such as the controller 120 may manage the thermal actuator's 400 wafer hold via the first vacuum line 412 and/or the second vacuum line 414 and may coordinate it with an X-Y position of the wafer 406 and the vacuum wands 118.

Figure 5:
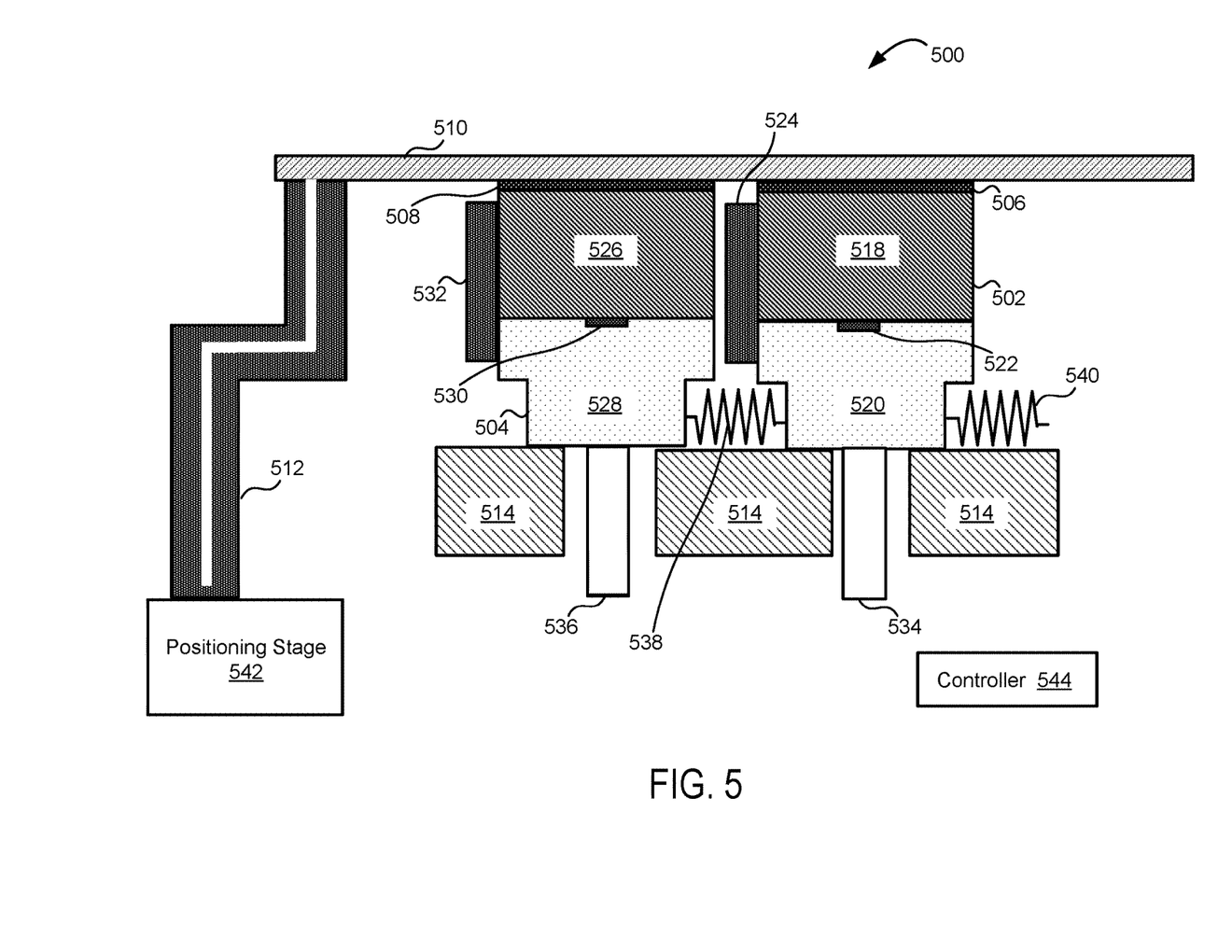
FIG. 5 schematically illustrates a cross-sectional view of a wafer-level die testing device, in accordance with various embodiments.

FIG. 5 schematically illustrates a cross-sectional view of a wafer-level die testing device 500, in accordance with various embodiments. In some embodiments, the view shown may be of a portion of a wafer-level die testing device such as the wafer-level die testing device 100 of FIG. 1. In various embodiments, the wafer-level die testing device 500 may include a first thermal actuator 502 and a second thermal actuator 504. A first thermal surface 506 of the first thermal actuator 502 and a second thermal surface 508 of the second thermal actuator 504 are shown in contact with a wafer 510 that may be supported by one or more peripheral vacuum wands 512. In some embodiments, the first thermal actuator 502 may correspond to thermal actuator 106a of FIG. 1, the second thermal actuator 504 may correspond to the thermal actuator 106e of FIG. 1, and the peripheral vacuum wand 512 may correspond to the peripheral vacuum wand 118*b* of FIG. 1. In some embodiments, the first thermal surface 506 and the second thermal surface 508 may be proud surfaces that are the highest point of the first thermal actuator 502 and the second thermal actuator 504, respectively.

In various embodiments, one or more of the first thermal actuator 502 and the second thermal actuator 504 may be movable in relation to a base 514 that may correspond to the base 102 of FIG. 1 in some embodiments. In various embodiments, the first thermal actuator 502 may include an actuator body having an upper portion 518 and a lower portion 520. In some embodiments, the first thermal actuator 502 may include a force sensor 522 that may sense a force applied between the first thermal actuator 502 and a wafer such as the wafer 510. In various embodiments, the force sensor 522 may be a load cell or some other type of force sensor. The first thermal actuator 502 may include a first Z-drive 524 that may control a Z-axis position of the upper portion 518 and the first thermal surface 506 in some embodiments. In various embodiments, the second thermal actuator 504 may include an actuator body having an upper portion 526 and a lower portion 528; a force sensor 530; and a Z-drive 532 that may be configured to operate in a similar fashion with respect to the second thermal actuator 504 as that described with respect to the components of the first thermal actuator 502. In some embodiments, the Z-drive 524 and/or the Z-drive 532 may be precision Z mechanisms that may provide a finely controlled distance between the wafer and a SIU or probe card, and may have sufficient range to enable calibration of the system for probe to pad alignment purposes.

In various embodiments, one or more first thermal actuator utilities 534 may be coupled with and/or be integrated as a part of the first thermal actuator 502. In some embodiments, the first thermal actuator utilities 534 may include temperature control mechanisms such as a heating and/or cooling device; sensing components such as temperature sensors; signal and/or power routing components; and/or vacuum devices. In various embodiments, one or more second thermal actuator utilities 536 may be coupled with and/or be integrated as a part of the second thermal actuator 504. The second thermal actuator utilities 536 may include components similar to those described with respect to the first thermal actuator utilities 534 and/or may include other components.

In various embodiments, a first adjustable link 538 may be coupled with the first thermal actuator 502 and the second thermal actuator 504. In some embodiments, the first adjustable link 538 may correspond to the adjustable link 112*b* of FIG. 1. In some embodiments, a second adjustable link 540 may be coupled with the first thermal actuator 502 at a first end. A second end of the second adjustable link 540 may be coupled with another thermal actuator (not shown for clarity), such as the thermal actuator 106*f* of FIG. 1. In various embodiments, the second end of the second adjustable link 540 may be coupled with the base 514 or a component fixed to the base 514 rather than being coupled with another thermal actuator. In some embodiments that include a fixed configuration of thermal actuators rather than an adjustable configuration of thermal actuators, the first adjustable link 538 and/or the second adjustable link 540 may not be present such that the first thermal actuator 502 and the second thermal actuator 504 remain fixed in relation to each other but still have individual dynamic thermal control capability. In some embodiments, one of the thermal actuators, such as the first thermal actuator 502 may be fixed in an X-Y direction relative to the base 514 such that it does not move when the first adjustable link 538 and/or the second adjustable link 540 are adjusted.

In some embodiments, the first thermal actuator 502, the second thermal actuator 504, and the first adjustable link 538 may be structured and coupled such that a predetermined minimum array pitch may be achieved with the actuators nearly touching. In some embodiments, the lower portions of the thermal actuator bodies may be narrower than the thermal surfaces to allow room for the adjustable links at a lower level and provide for the predetermined minimum array pitch between the thermal surfaces.

In some embodiments, a positioning stage 542 may be coupled with the peripheral vacuum wand 512 and/or other components. In various embodiments, the positioning stage 542 may be an X-Y-Theta stage that allows motion in the X and Y directions as well as rotational motion, designated by a rotational angle theta. In some embodiments, a controller 544, that may correspond to the controller 120 of FIG. 1, may be in signal communication with and/or coupled with the first thermal actuator utilities 534, the second thermal actuator utilities 536, the force sensor 522, the force sensor 530, the Z-drive 524, the Z-drive 532, the positioning stage 542 and/or other components. In some embodiments, the force sensors 522, 530 may be used for vertical force sensing for integration with a probing by force and/or force-feedback technique.

In various embodiments, each thermal actuator surface temperature and height may be individually controlled, such as by controlling the Z-drive 524 and the Z-drive 532 independent of one another with the controller 544, and by controlling the temperature of the first thermal surface 506 and the second thermal surface 508 independent of one another using the first thermal actuator utilities 534 and the second thermal actuator utilities 536 that may be controlled by the controller 544. In some embodiments, the independent height control of each thermal actuator may enable local adjustment of the probing force and may allow tuning the overdrive to improve contact resistance performance of a site. In various embodiments, the local and independent control of probing overdrive may also allow for the use of a modular parallel SIU (e.g. modular probe card 300) that may be more cost effective and may have a larger test site count than previous SIU tooling and techniques.

In various embodiments, the wafer-level die testing device 100 of FIGS. 1 and 2 and/or the wafer-level die testing device 500 may help achieve KGD using wafer-level testing by enabling full class-test like content at the wafer level by providing tight dynamic or static thermal control, the ability to test dies at two or more temperature set points, including a predetermined cold temperature for cold defect detection and a predetermined hot temperature for device classification, and a local probing solution to enable cheaper overall tooling (SIU) cost. In various embodiments, the wafer-level die testing device 100 and/or the wafer-level die testing device 500 may be compatible with a modified SDx solution that may run an edge die monitor test for defects due to wafer grinding, polishing, and/or dicing. In some embodiments, the temperature set points may be dynamically switchable during operation of the wafer-level die testing device 100 and/or the wafer-level die testing device 500, including during dynamic testing of a DUT.

Figure 6:
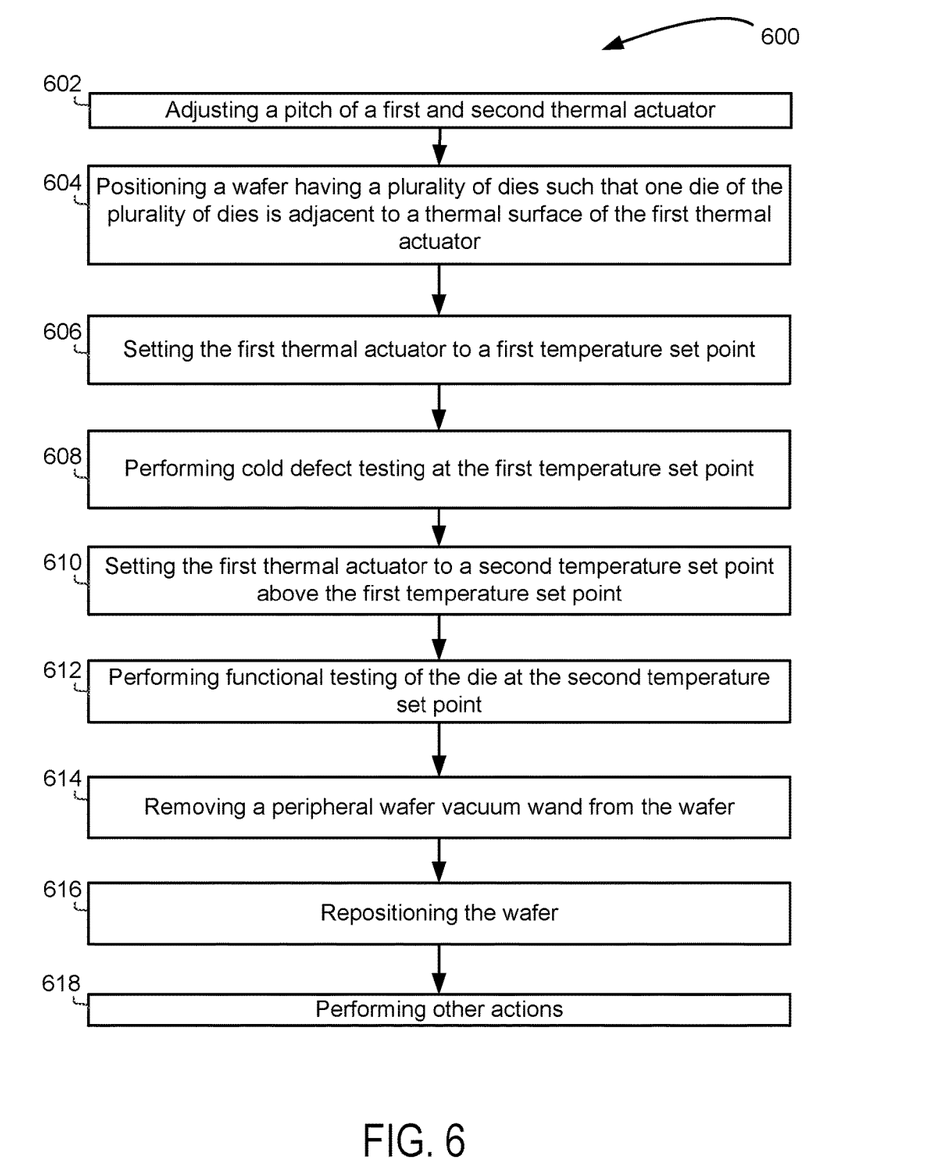
FIG. 6 schematically illustrates a flow diagram for a process of wafer-level die testing, in accordance with various embodiments.

FIG. 6 schematically illustrates a flow diagram for a process 600 of wafer-level die testing, in accordance with various embodiments. In some embodiments, the process 600 may include, at a block 602, adjusting a pitch of a first thermal actuator and a second thermal actuator coupled with a base (e.g., base 102 of FIG. 1 or base 514 of FIG. 5) by adjusting one or more of a plurality of adjustable links (e.g. adjustable links 112, 538, and/or 540). In various embodiments, the links may be activated and adjusted during wafer lot preparation, with their length adjusted such that the individual thermal actuators are placed under each of a set of fixed test sites. In some embodiments, the adjustable links may be adjusted in a coordinated fashion and/or using ganged control. In various embodiments, an X pitch and/or a Y pitch may be adjusted. In some embodiments, the links may be adjusted in response to control signals from a controller (e.g., controller 120 and/or controller 544). At a block 604, the process 600 may include positioning a wafer (e.g., wafer 116 of FIGS. 1 and 2, wafer 406 of FIG. 4, or wafer 510 of FIG. 5) having a plurality of dies such that one die of the plurality of dies is adjacent to a thermal surface (e.g., one of the thermal surfaces 108 of FIG. 1, thermal surface 402 of FIG. 4, or one of thermal surfaces 504 and 506 of FIG. 5) of the first thermal actuator (e.g., one of thermal actuators 106 of FIGS. 1 and 2, thermal actuator 400 of FIG. 4, or one of thermal actuators 502 and 504 of FIG. 5) coupled with the base. In some embodiments, positioning the wafer may include positioning the wafer such that a second die of the plurality of dies is adjacent to a second thermal surface of the second thermal actuator coupled with the base.

In various embodiments, positioning the wafer at the block 604 may include: sensing a first compression force between the first thermal surface and the first die (e.g., using force sensor 522 of FIG. 5); sensing a second compression force between the second thermal surface and the second die (e.g., using force sensor 530 of FIG. 5); adjusting a position of the first thermal surface based at least in part on the first compression force (e.g., with Z-drive 524 receiving signals from controller 544 based at least in part on the sensed first compression force); and adjusting a position of the second thermal surface based at least in part on the second compression force (e.g., with Z-drive 532 receiving signals from controller 544 based at least in part on the sensed second compression force). In some embodiments, positioning the wafer at the block 604 may include adjusting a stage (e.g., positioning stage 542 of FIG. 5) coupled with a plurality of peripheral wafer vacuum wands to align the first thermal surface with the first die and the second thermal surface with the second die. In various embodiments, positioning the wafer may include receiving control signals from a controller (e.g., controller 120 and/or 544) and positioning the wafer in response to the control signals.

At a block 606, the process 600 may include setting the first thermal actuator to a first temperature set point. At a block 608, the process may include performing cold defect testing at the first temperature set point. In some embodiments, the process 600 may include setting the thermal actuator to a second temperature set point above the first temperature set point at a block 610. At a block 612, the process 600 may include performing functional testing of the die at the second temperature set point (e.g., using modular probe array 300 in conjunction with thermal actuators 106). At a block 614, the process 600 may include removing a peripheral vacuum wand from the wafer that blocks access to a third die of the plurality of dies from the thermal surface. At a block 616, the process 600 may include repositioning the wafer such that the third die of the plurality of dies is adjacent to the first thermal surface and a fourth die of the plurality of dies is adjacent to the second thermal surface. In various embodiments, at a block 618, the process 600 may include performing other actions, such as performing additional cold defect and/or functional testing after repositioning the wafer and/or performing other actions. In various embodiments, one or more of the actions performed at the blocks 606, 608, 610, 612, 614, 616, and/or 618 may include performing the action in response to one or more control signals from a controller (e.g., controller 120 and/or controller 544).

Figure 7:
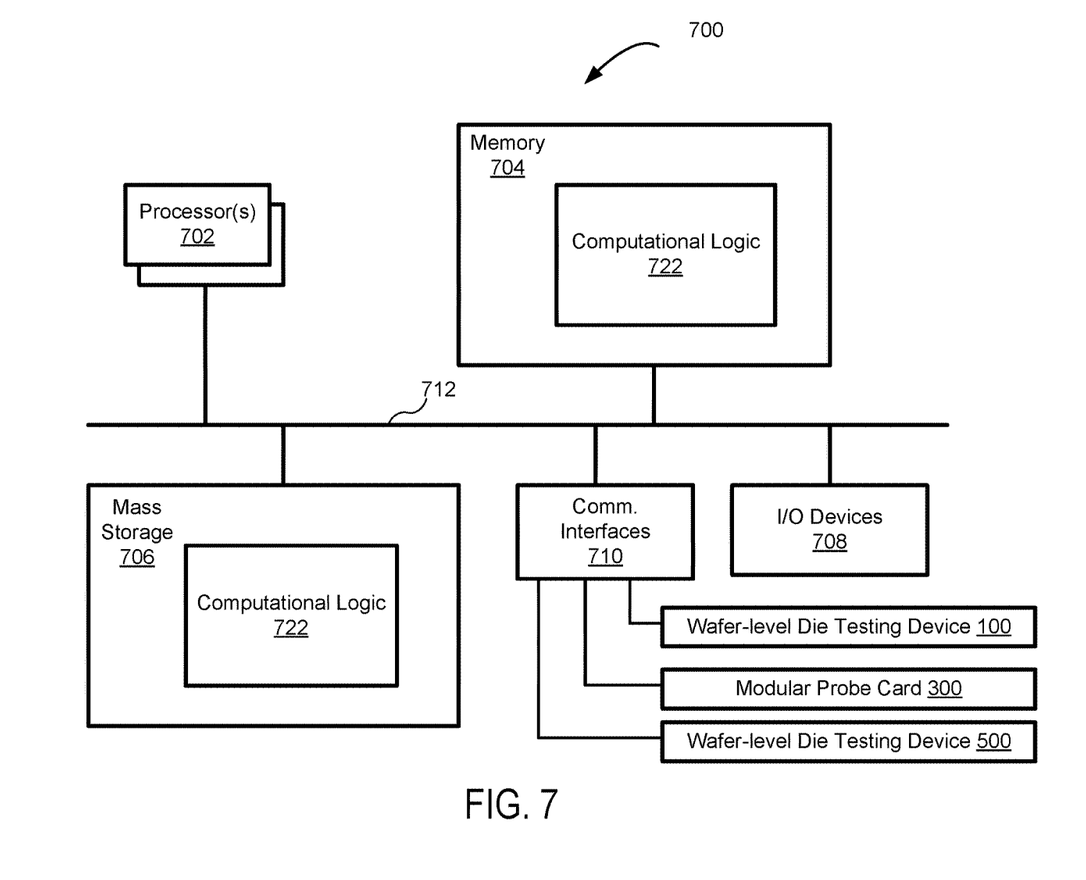
FIG. 7 schematically illustrates an example computing device, in accordance with various embodiments.

FIG. 7 illustrates an example computing device 700 suitable for use with various components and methods of FIGS. 1-6, such as: wafer-level die testing device 100 including adjustable links 112, and thermal actuators 106 described with respect to FIGS. 1 and 2; modular probe card 300 described with respect to FIG. 3; thermal actuator 400 described with respect to FIG. 4; thermal actuators 502 and 504, thermal actuator utilities 534 and 536, adjustable links 538 and 540, Z-drives 524 and 532, and/or positioning stage 542 described with respect to FIG. 5; the method 600 described with respect to FIG. 6; and/or other devices, components or methods in accordance with various embodiments.

In various embodiments, the computing device 700 may be an implementation of the controller 120 of FIGS. 1 and 2, the controller 544 of FIG. 5, and/or include the controller 120 or the controller 544 as a component. As shown, computing device 700 may include one or more processors or processor cores 702 and system memory 704. For the purpose of this application, including the claims, the terms "processor" and "processor cores" may be considered synonymous, unless the context clearly requires otherwise. The processor 702 may include any type of processors, such as a central processing unit (CPU), a microprocessor, and the like. The processor 702 may be implemented as an integrated circuit having multi-cores, e.g., a multi-core microprocessor. The computing device 700 may include mass storage devices 706 (such as diskette, hard drive, volatile memory (e.g., dynamic random-access memory (DRAM), compact disc read-only memory (CD-ROM), digital versatile disk (DVD), and so forth). In general, system memory 704 and/or mass storage devices 706 may be temporal and/or persistent storage of any type, including, but not limited to, volatile and non-volatile memory, optical, magnetic, and/or solid state mass storage, and so forth. Volatile memory may include, but is not limited to, static and/or dynamic random access memory. Non-volatile memory may include, but is not limited to, electrically erasable programmable read-only memory, phase change memory, resistive memory, and so forth.

The computing device 700 may further include input/output devices 708 (such as a display (e.g., a touchscreen display), keyboard, cursor control, remote control, gaming controller, image capture device, and so forth) and communication interfaces 710 (such as network interface cards, modems, infrared receivers, radio receivers (e.g., Bluetooth), and so forth). In various embodiments, the wafer-level die testing device 100, the modular probe card 300, and/or the wafer-level die testing device 500 may be coupled with the communications interfaces 710 and/or another component of the computing device 700. In various embodiments, one or more of the wafer-level die testing device 100, the modular probe card 300 and/or the wafer-level die testing device 500 may receive control signals (e.g., adjustable link control signals, temperature control signals, Z-drive control signals, vacuum control signals, stage positioning signals, modular probe control signals and/or other control signals) from the computing device 700 and/or may provide data signals (e.g., sensed force data, sensed temperature data, and/or position data) to the computing device 700. In various embodiments, digital and/or analog signals may be used for communication between the computing device 700 and one or more of the wafer-level die testing device 100, the modular probe card 300, and/or the wafer-level die testing device 500.

The communication interfaces 710 may include communication chips (not shown) that may be configured to operate the device 700 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 710 may operate in accordance with other wireless protocols in other embodiments.

The above-described computing device 700 elements may be coupled to each other via system bus 712, which may represent one or more buses. In the case of multiple buses, they may be bridged by one or more bus bridges (not shown). Each of these elements may perform its conventional functions known in the art. In particular, system memory 704 and mass storage devices 706 may be employed to store a working copy and a permanent copy of the programming instructions, such as drivers, for the operation of various components of computer system 700, including but not limited to the operation of the controller 120 of FIGS. 1 and 2, the controller 544 of FIG. 5, an operating system of computer system 700, and/or one or more applications, collectively referred to as computational logic 722. The various elements may be implemented by assembler instructions supported by processor(s) 702 or high-level languages that may be compiled into such instructions.

The permanent copy of the programming instructions may be placed into mass storage devices 706 in the factory or in the field through, for example, a distribution medium (not shown), such as a compact disc (CD), or through communication interface 710 (from a distribution server (not shown)). That is, one or more distribution media having an implementation of the agent program may be employed to distribute the agent and to program various computing devices.

The number, capability, and/or capacity of the elements 708, 710, 712 may vary, depending on whether computing device 700 is used as a stationary computing device, such as a set-top box or desktop computer, or a mobile computing device, such as a tablet computing device, laptop computer, game console, or smartphone. Their constitutions are otherwise known, and accordingly will not be further described.

For some embodiments, at least one of processors 702 may be packaged together with all or portions of computational logic 722 configured to facilitate aspects of embodiments described herein to form a System in Package (SiP) or a System on Chip (SoC).

The computing device 700 may include or otherwise be associated with a controller or other component of a wafer-level die testing device that may include components and/or implement methods described with respect to FIGS. 1-6, such as: wafer-level die testing device 100, implementing aspects of the controller 120; wafer-level die testing device 500, implementing aspects of the controller 544; and/or process 600 of FIG. 6. In some embodiments, one or more components such as processor 702 may be included as a part of the wafer-level die testing device 100 and/or the wafer-level die testing device 500.

In various implementations, the computing device 700 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 700 may be any other electronic device that processes data.

Figure 8:
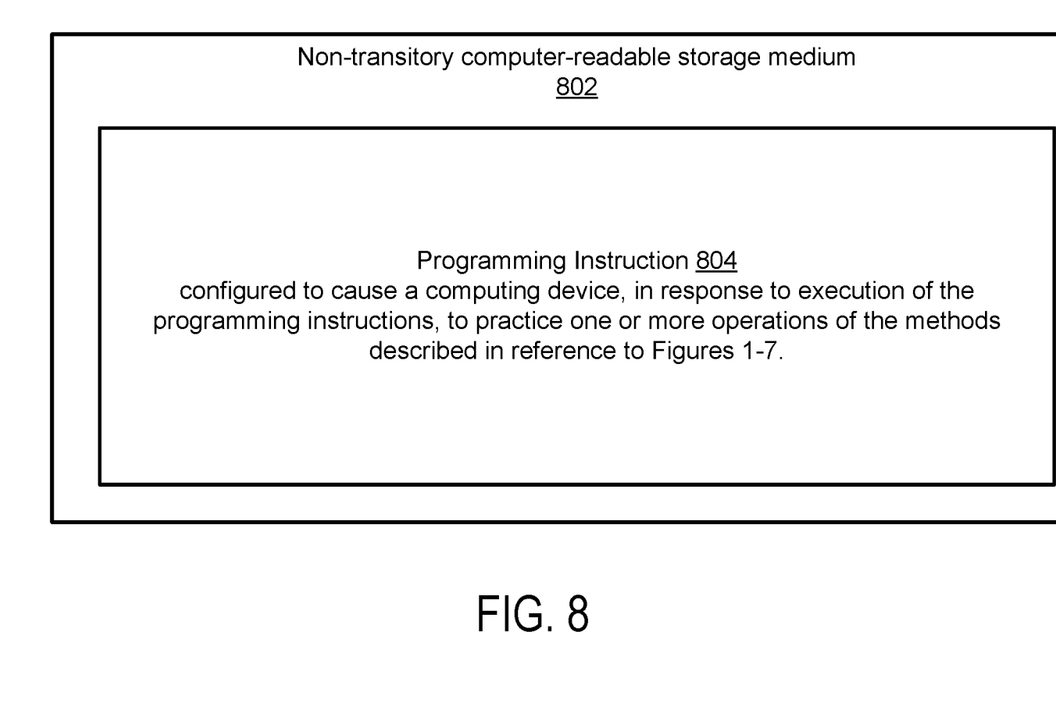
FIG. 8 schematically illustrates an example computer-readable storage medium, in accordance with various embodiments.

FIG. 8 illustrates example computer-readable storage medium 802 having instructions configured to practice all or selected ones of the operations associated with the computing device 700, earlier described with respect to FIG. 7; the controller 120 of FIGS. 1 and 2; and/or the controller 544 of FIG. 5, in accordance with various embodiments. As illustrated, computer-readable storage medium 802 may include a number of programming instructions 804. The storage medium 802 may represent a broad range of non-transitory persistent storage medium known in the art, including but not limited to flash memory, dynamic random access memory, static random access memory, an optical disk, a magnetic disk, etc. Programming instructions 804 may be configured to enable a device, e.g., computer 700, controller 120, and/or controller 544 in response to execution of the programming instructions 804, to perform, e.g., but not limited to, various operations described for the controller 120 shown in FIGS. 1 and 2, the controller 544 shown in FIG. 5, or operations described with respect to process 600 of FIG. 6. In alternate embodiments, programming instructions 804 may be disposed on multiple computer-readable storage media 802. In alternate embodiment, storage medium 802 may be transitory, e.g., signals encoded with programming instructions 804.

Referring back to FIG. 7, for an embodiment, at least one of processors 702 may be packaged together with memory having all or portions of computational logic 722 configured to practice aspects described for the controller 120 shown in FIGS. 1 and 2, the controller 544 shown in FIG. 5, and/or operations shown in process 600 of FIG. 6. For an embodiment, at least one of processors 702 may be packaged together with memory having all or portions of computational logic 722 configured to practice aspects described for the controller 120 shown in FIGS. 1 and 2, the controller 544 shown in FIG. 5, and/or operations shown in process 600 of FIG. 6 to form a System in Package (SiP). For an embodiment, at least one of processors 702 may be integrated on the same die with memory having all or portions of computational logic 722 configured to practice aspects described for the controller 120 shown in FIGS. 1 and 2, the controller 544 shown in FIG. 5, and/or operations shown in process 600 of FIG. 6. For an embodiment, at least one of processors 702 may be packaged together with memory having all or portions of computational logic 722 configured to practice aspects of the controller 120 shown in FIGS. 1 and 2, the controller 544 shown in FIG. 5, and/or operations shown in process 600 of FIG. 6 to form a System on Chip (SoC). For at least one embodiment, the SoC may be utilized in, e.g., but not limited to, a mobile computing device such as a wearable device and/or a smartphone.

Machine-readable media (including non-transitory machine-readable media, such as machine-readable storage media), methods, systems and devices for performing the above-described techniques are illustrative examples of embodiments disclosed herein. Additionally, other devices in the above-described interactions may be configured to perform various disclosed techniques.

The following paragraphs provide examples of various ones of the embodiments disclosed herein.

Example 1 may include a wafer-level die testing apparatus comprising: a base having a planar X-Y surface in an X-Y-Z Cartesian coordinate system; a plurality of thermal actuators situated on the surface, wherein one or more of the plurality of thermal actuators is movable in relation to the base in at least one of the X or the Y directions; and one or more adjustable links, wherein each adjustable link is operable to adjust a relative position between an individual thermal actuator of the plurality of thermal actuators and one or more other thermal actuators of the plurality of thermal actuators in one or more of the X or the Y directions.

Example 2 may include the subject matter of Example 1, wherein each thermal actuator in the plurality of thermal actuators includes a temperature control mechanism that is controlled independently of other thermal actuators in the plurality of thermal actuators.

Example 3 may include the subject matter of Example 2, wherein each temperature control mechanism allows for at least two temperature set points that are dynamically switchable during operation of the thermal actuator.

Example 4 may include the subject matter of any one of Examples 1-3, wherein each thermal actuator includes: a thermal surface substantially parallel to the planar surface of the base; and an independently controllable z-drive to control a position of the thermal surface relative to the planar surface of the base in the Z direction.

Example 5 may include the subject matter of any one of Examples 1-4, wherein the plurality of thermal actuators is arranged in a rectangular array.

Example 6 may include the subject matter of any one of Examples 1-5, wherein each adjustable link connects adjacent thermal actuators in one of the X or the Y direction.

Example 7 may include the subject matter of any one of Examples 1-6, wherein one of the thermal actuators is fixed in the X and the Y directions in relation to the base.

Example 8 may include a wafer-level die testing apparatus comprising: a base having a planar X-Y surface in an X-Y-Z Cartesian coordinate system; and a plurality of thermal actuators situated on the surface, wherein each thermal actuator in the plurality of thermal actuators includes: an independently controllable temperature control mechanism; a thermal surface; and an independently controllable z-drive that adjusts a distance between the thermal surface and the planar surface of the base in the Z direction.

Example 9 may include the subject matter of Example 8, further comprising one or more adjustable links, wherein each adjustable link is operable to adjust a relative position between an individual thermal actuator of the plurality of thermal actuators and one or more other thermal actuators of the plurality of thermal actuators in one or more of the X or the Y directions.

Example 10 may include the subject matter of any one of Examples 8-9, further comprising a controller coupled with each of the plurality of thermal actuators to dynamically control the temperature of each thermal actuator independently of the other thermal actuators.

Example 11 may include the subject matter of Example 10, wherein the controller is also coupled with each of the adjustable links to control a pitch of the plurality of thermal actuators.

Example 12 may include the subject matter of any one of Examples 9-11, wherein the one or more adjustable links include one or more of a screw drive, an electro-magnetic cylinder, or a hydraulic linear actuator.

Example 13 may include a method of wafer-level die testing comprising: positioning, in response to a controller, a wafer having a plurality of dies such that one die of the plurality of dies is adjacent to a thermal surface of a thermal actuator coupled with a base; setting, in response to the controller, the thermal actuator to a first temperature set point; performing, in response to the controller, cold defect testing at the first temperature set point; setting, in response to the controller, the thermal actuator to a second temperature set point above the first temperature set point; and performing, in response to the controller, functional testing of the die at the second temperature set point.

Example 14 may include the subject matter of Example 13, wherein the die is a first die, the thermal surface is a first thermal surface of a first thermal actuator, and wherein positioning the wafer includes positioning the wafer such that a second die of the plurality of dies is adjacent to a second thermal surface of a second thermal actuator coupled with the base.

Example 15 may include the subject matter of Example 14, further comprising adjusting, in response to the controller, a pitch of the first and second thermal actuators before positioning the wafer.

Example 16 may include the subject matter of any one of Examples 14-15, further comprising: sensing a first compression force between the first thermal surface and the first die; sensing a second compression force between the second thermal surface and the second die; adjusting, in response to the controller, a position of the first thermal surface based at least in part on the first compression force; and adjusting, in response to the controller, a position of the second thermal surface based at least in part on the second compression force.

Example 17 may include the subject matter of any one of Examples 14-16, further comprising repositioning, in response to the controller, the wafer such that a third die of the plurality of dies is adjacent to the first thermal surface and a fourth die of the plurality of dies is adjacent to the second thermal surface.

Example 18 may include the subject matter of Example 17, further comprising removing, in response to the controller, a peripheral wafer vacuum wand from the wafer that blocks access to the third die from the first thermal surface before repositioning the wafer.

Example 19 may include the subject matter of any one of Examples 14-18, wherein positioning the wafer includes adjusting, in response to the controller, a stage coupled with a plurality of peripheral wafer vacuum wands to align the first thermal surface with the first die and the second thermal surface with the second die.

Example 20 may include one or more computer-readable media comprising instructions that cause a controller coupled with a wafer-level die testing device, in response to execution of the instructions by the controller, to: adjust at least one of a first pitch in a first direction, X, or a second pitch in a second direction, Y, normal to the X direction of a plurality of thermal actuators situated on a base of the wafer-level die testing device; dynamically control a first temperature of a first thermal actuator of the plurality of thermal actuators during wafer-level die testing; and dynamically control a second temperature of a second thermal actuator of the plurality of thermal actuators independently of the dynamic control of the first temperature.

Example 21 may include the subject matter of Example 20, wherein the instructions are to cause the controller to adjust both the first pitch and the second pitch of the plurality of thermal actuators.

Example 22 may include the subject matter of any one of Examples 20-21, wherein the instructions are also to cause the controller to adjust a position of a first thermal surface of a first thermal actuator of the plurality of thermal actuators in a third direction, Z, normal to the X and Y directions; and adjust a position of a second thermal surface of a second thermal actuator of the plurality of thermal actuators in the Z direction, independently of the adjustment of the first thermal surface.

Example 23 may include the subject matter of Example 22, wherein the instructions are to cause the controller to adjust the position of the first thermal surface based at least in part on a sensed force between the first thermal surface and a wafer.

Example 24 may include the subject matter of any one of Examples 20-23, wherein the instructions are also to cause the controller to position a wafer having a plurality of dies such that a first die of the plurality of dies is adjacent to a first thermal surface of a first thermal actuator of the plurality of thermal actuators and such that a second die of the plurality of dies is adjacent to a second thermal interface of a second thermal actuator of the plurality of thermal actuators.

Example 25 may include the subject matter of Example 24, wherein the first thermal surface is adjacent to a first side of the first die, the second thermal surface is adjacent to a first side of the second die, and the instructions are also to cause the controller to position the wafer such that a second side of the first die contacts a first probe array of a modular probe card and a second side of the second die contacts a second probe array of the modular probe card.

Example 26 may include a wafer-level die testing apparatus comprising: means for supporting a plurality of thermal actuators on a planar X-Y surface in an X-Y-Z Cartesian coordinate system, wherein one or more of the plurality of thermal actuators are movable in relation to the means for supporting the plurality of thermal actuators; and one or more means for adjusting a relative position between an individual thermal actuator of the plurality of thermal actuators and one or more other thermal actuators of the plurality of thermal actuators in one or more of the X or the Y directions.

Example 27 may include the subject matter of Example 26, wherein each thermal actuator in the plurality of thermal actuators includes means for controlling a temperature of the thermal actuator independently of other thermal actuators in the plurality of thermal actuators.

Example 28 may include the subject matter of Example 27, wherein the means for controlling the temperature includes means for dynamically switching between at least two temperature set points during operation of the thermal actuator.

Example 29 may include the subject matter of any one of Examples 26-28, further comprising means for controlling a position of a thermal surface of each thermal actuator in the Z direction relative to the planar X-Y surface.

Example 30 may include the subject matter of any one of Examples 26-28, wherein the plurality of thermal actuators is arranged in a rectangular array.

Example 31 may include the subject matter of any one of Examples 26-30, wherein each of the means for adjusting a relative position between an individual thermal actuator and one or more other thermal actuators connects adjacent thermal actuators in one of the X or the Y direction.

Example 32 may include the subject matter of any one of Examples 26-31, wherein one of the thermal actuators is fixed in the X and the Y directions in relation to the means for supporting the plurality of thermal actuators.

What is claimed is:

1. A wafer-level die testing apparatus comprising:
    a base having a planar X-Y surface in an X-Y-Z Cartesian coordinate system;
    a plurality of thermal actuators situated on the surface, wherein one or more of the plurality of thermal actuators is movable in relation to the base in at least one of the X or the Y directions; and
    one or more adjustable links, wherein each adjustable link is operable to adjust a relative position between an individual thermal actuator of the plurality of thermal actuators and one or more other thermal actuators of the plurality of thermal actuators in one or more of the X or the Y directions.

2. The apparatus of claim 1, wherein each thermal actuator in the plurality of thermal actuators includes a temperature control mechanism that is controlled independently of other thermal actuators in the plurality of thermal actuators.

3. The apparatus of claim 2, wherein each temperature control mechanism allows for at least two temperature set points that are dynamically switchable during operation of the thermal actuator.

4. The apparatus of claim 1, wherein each thermal actuator includes:
    a thermal surface substantially parallel to the planar surface of the base; and
    an independently controllable z-drive to control a position of the thermal surface relative to the planar surface of the base in the Z direction.

5. The apparatus of claim 1, wherein the plurality of thermal actuators is arranged in a rectangular array.

6. The apparatus of claim 5, wherein each adjustable link connects adjacent thermal actuators in one of the X or the Y direction.

7. The apparatus of claim 6, wherein one of the thermal actuators is fixed in the X and the Y directions in relation to the base.

8. A wafer-level die testing apparatus comprising:
    a base having a planar X-Y surface in an X-Y-Z Cartesian coordinate system; and
    a plurality of thermal actuators situated on the surface, wherein each thermal actuator in the plurality of thermal actuators includes:
        an independently controllable temperature control mechanism;
        a thermal surface; and
        an independently controllable z-drive that adjusts a distance between the thermal surface and the planar surface of the base in the Z direction.

9. The apparatus of claim 8, further comprising one or more adjustable links, wherein each adjustable link is operable to adjust a relative position between an individual thermal actuator of the plurality of thermal actuators and one or more other thermal actuators of the plurality of thermal actuators in one or more of the X or the Y directions.

10. The apparatus of claim 9, further comprising a controller coupled with each of the plurality of thermal actuators to dynamically control the temperature of each thermal actuator independently of the other thermal actuators.

11. The apparatus of claim 10, wherein the controller is also coupled with each of the adjustable links to control a pitch of the plurality of thermal actuators.

12. The apparatus of claim 9, wherein the one or more adjustable links include one or more of a screw drive, an electro-magnetic cylinder, or a hydraulic linear actuator.

13. A method of wafer-level die testing comprising:
positioning, in response to a controller, a wafer having a plurality of dies such that one die of the plurality of dies is adjacent to a thermal surface of a thermal actuator coupled with a base;
setting, in response to the controller, the thermal actuator to a first temperature set point;
performing, in response to the controller, cold defect testing at the first temperature set point;
setting, in response to the controller, the thermal actuator to a second temperature set point above the first temperature set point; and
performing, in response to the controller, functional testing of the die at the second temperature set point.

14. The method of claim 13, wherein the die is a first die, the thermal surface is a first thermal surface of a first thermal actuator, and wherein positioning the wafer includes positioning the wafer such that a second die of the plurality of dies is adjacent to a second thermal surface of a second thermal actuator coupled with the base.

15. The method of claim 14, further comprising adjusting, in response to the controller, a pitch of the first and second thermal actuators before positioning the wafer.

16. The method of claim 14, further comprising:
sensing a first compression force between the first thermal surface and the first die;
sensing a second compression force between the second thermal surface and the second die;
adjusting, in response to the controller, a position of the first thermal surface based at least in part on the first compression force; and
adjusting, in response to the controller, a position of the second thermal surface based at least in part on the second compression force.

17. The method of claim 14, further comprising repositioning, in response to the controller, the wafer such that a third die of the plurality of dies is adjacent to the first thermal surface and a fourth die of the plurality of dies is adjacent to the second thermal surface.

18. The method of claim 17, further comprising removing, in response to the controller, a peripheral wafer vacuum wand from the wafer that blocks access to the third die from the first thermal surface before repositioning the wafer.

19. The method of claim 14, wherein positioning the wafer includes adjusting, in response to the controller, a stage coupled with a plurality of peripheral wafer vacuum wands to align the first thermal surface with the first die and the second thermal surface with the second die.

20. One or more computer-readable media comprising instructions that cause a controller coupled with a wafer-level die testing device, in response to execution of the instructions by the controller to:
adjust at least one of a first pitch in a first direction, X, or a second pitch in a second direction, Y, normal to the X direction of a plurality of thermal actuators situated on a base of the wafer-level die testing device;
dynamically control a first temperature of a first thermal actuator of the plurality of thermal actuators during wafer-level die testing; and
dynamically control a second temperature of a second thermal actuator of the plurality of thermal actuators independently of the dynamic control of the first temperature.

21. The one or more computer-readable media of claim 20, wherein the instructions are to cause the controller to adjust both the first pitch and the second pitch of the plurality of thermal actuators.

22. The one or more computer-readable media of claim 20, wherein the instructions are also to cause the controller to adjust a position of a first thermal surface of a first thermal actuator of the plurality of thermal actuators in a third direction, Z, normal to the X and Y directions; and adjust a position of a second thermal surface of a second thermal actuator of the plurality of thermal actuators in the Z direction, independently of the adjustment of the first thermal surface.

23. The one or more computer-readable media of claim 22, wherein the instructions are to cause the controller to adjust the position of the first thermal surface based at least in part on a sensed force between the first thermal surface and a wafer.

24. The one or more computer-readable media of claim 20, wherein the instructions are also to cause the controller to position a wafer having a plurality of dies such that a first die of the plurality of dies is adjacent to a first thermal surface of a first thermal actuator of the plurality of thermal actuators and such that a second die of the plurality of dies is adjacent to a second thermal interface of a second thermal actuator of the plurality of thermal actuators.

25. The one or more computer-readable media of claim 24, wherein the first thermal surface is adjacent to a first side of the first die, the second thermal surface is adjacent to a first side of the second die, and the instructions are also to cause the controller to position the wafer such that a second side of the first die contacts a first probe array of a modular probe card and a second side of the second die contacts a second probe array of the modular probe card.

* * * * *